United States Patent [19]

Gunell et al.

[11] Patent Number: 4,752,107
[45] Date of Patent: Jun. 21, 1988

[54] FORWARD FACING WIRE WRAP

[75] Inventors: Gary J. Gunell; Scott Hopper, both of Seattle, Wash.

[73] Assignee: Telzon, Inc., Seattle, Wash.

[21] Appl. No.: 760,677

[22] Filed: Jul. 30, 1985

[51] Int. Cl.$^4$ ............................................. H01R 9/22
[52] U.S. Cl. .................................... 439/709; 174/60; 379/326; 439/716; 439/718
[58] Field of Search ............ 339/198 R, 198 J, 198 G, 339/198 GA, 198 H, 125 R, 18 R, 18 B, 14 R, 125 R; 179/91 R, 98, 178, 179; 174/60, 59

[56] References Cited

U.S. PATENT DOCUMENTS

| | | |
|---|---|---|
| 3,327,278 | 6/1967 | Godel . |
| 3,329,927 | 7/1967 | Ayers . |
| 3,408,613 | 10/1968 | Baker . |
| 3,518,611 | 6/1970 | Shores . |
| 3,564,479 | 2/1971 | Gluntz . |
| 3,564,485 | 2/1971 | Cull et al. . |
| 3,573,373 | 4/1971 | Mullan ................................. 179/98 |
| 3,611,268 | 10/1971 | Webb ............................ 339/151 M |
| 3,629,788 | 12/1971 | Hartley ............................ 339/18 B |
| 3,714,618 | 1/1973 | Appleton ........................ 339/198 R |
| 3,729,698 | 4/1973 | Chapman ........................ 339/18 R |
| 3,760,328 | 9/1973 | Georgopulos .................... 339/18 R |
| 3,784,728 | 1/1974 | De Bortoli et al. ............... 339/18 B |
| 3,796,848 | 3/1974 | Southworth .................... 339/17 LC |
| 3,814,990 | 6/1974 | Warman et al. .................... 317/122 |
| 3,832,498 | 8/1974 | Lawson ................................. 179/98 |
| 3,935,372 | 1/1976 | Triplett et al. .................... 174/68.5 |
| 3,936,133 | 2/1976 | Splitt et al. ...................... 339/198 R |
| 3,955,868 | 5/1976 | Kindermann et al. ............ 339/18 B |
| 4,012,096 | 3/1977 | De Luca et al. .................. 339/18 R |
| 4,021,096 | 3/1977 | Dragt ..................................... 350/6 |
| 4,037,910 | 7/1977 | Paluch ............................ 339/198 R |
| 4,053,719 | 10/1977 | Debortoli et al. ..................... 179/98 |
| 4,087,648 | 5/1978 | Giacoppo .............................. 179/98 |
| 4,089,580 | 5/1978 | Huffnagle et al. ............... 339/99 R |
| 4,116,525 | 9/1978 | Johnston ......................... 339/132 B |
| 4,131,934 | 12/1978 | Becker et al. ......................... 174/72 |
| 4,160,880 | 7/1979 | Brey ..................................... 179/98 |
| 4,176,257 | 11/1979 | DeLuca ............................... 179/98 |
| 4,210,375 | 7/1980 | Saligny ............................ 339/14 L |
| 4,273,966 | 6/1981 | Briggs et al. ......................... 179/98 |
| 4,313,039 | 1/1982 | DeLuca et al. ....................... 179/98 |
| 4,538,868 | 9/1985 | Cruise et al. .................... 339/198 R |
| 4,548,366 | 10/1985 | Wirz et al. ....................... 242/180 D |

FOREIGN PATENT DOCUMENTS 1206354 12/1958 France .......................... 339/198 GA Primary Examiner—Gil Weidenfeld
Assistant Examiner—Thomas M. Kline
Attorney, Agent, or Firm—Weingarten, Schurgin, Gagnebin & Hayes

[57] ABSTRACT

A forward facing connectorized terminal block is provided which contains an array of wire wrap or insulation displacement terminals in a forward facing terminal field readily accessible for cross connection to the telecommunications wires. Connectorized cables from telecommunications equipment are plugged into mating connectors mounted on the terminal block and which are wired to the rear terminal portions of the terminal field. The terminal block is extremely compact and is easily attached and removed by a snap action mounting bracket.

9 Claims, 2 Drawing Sheets

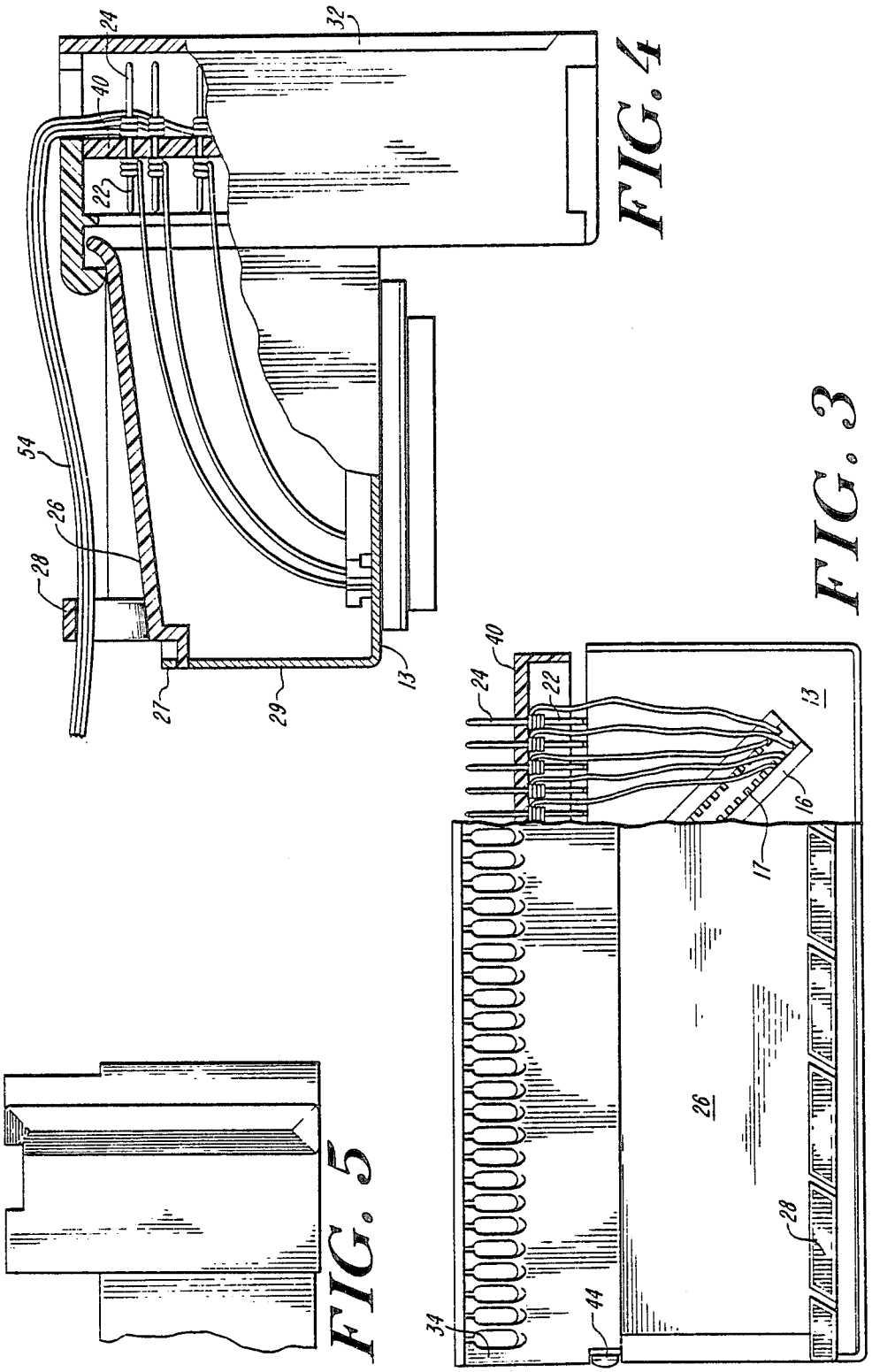

FORWARD FACING WIRE WRAP

FIELD OF THE INVENTION

This invention relates to connector blocks for telephone and other telecommunications lines and more particularly to a connectorized terminal block for use on central office or PBX distributing frames.

BACKGROUND OF THE INVENTION

In a telecommunications central office or PBX (private branch exchange) the wires from telephones and other telecommunications apparatus are usually connected to the telecommunications lines by connector blocks which include a plurality of terminals to which the wires of the telecommunications apparatus are connected, the terminals also being connected to the telecommunications lines. Space is usually a major factor in any telecommunications installation, and it is desirable that the connecting block accommodate the intended number of terminals and connections within the smallest practicable volume. Many different connector blocks configurations are known, but are deficient or not wholly desirable in their construction or performance for many purposes, especially PBX systems and other office telecommunications systems in which relatively little space is available for the centralized telecommunications equipment including the associated connector blocks.

SUMMARY OF THE INVENTION

The present invention provides a forward facing connectorized terminal block which contains an array of wire wrap or insulation displacement terminals in a forward facing terminal field readily accessible for cross connection to the telecommunications wires. Connectorized cables from the telecommunications equipment are plugged into mating connectors mounted on the terminal block and which are wired to the rear terminal portions of the terminal field. The connectorized terminal block is extremely compact and is easily attached and removed by a snap action mounting bracket. The housing is constructed to provide access to the internal wiring, from the housing connectors to the terminal field, with no impairment to the cross connecting wiring from the terminal field to the telecommunications wires. The housing also includes fanning strips for routing and retention of the cross connecting wires in orderly fashion.

DESCRIPTION OF THE DRAWINGS

The invention will be more fully understood from the following detailed description taken in conjunction with the accompanying drawings in which:

FIG. 3 is a partly cutaway top view of the terminal block;

FIG. 4 is a partly cutaway side view of the terminal block; and

FIG. 5 is a partly cutaway rear view of the terminal block.

DETAILED DESCRIPTION OF THE INVENTION

Figure 1:
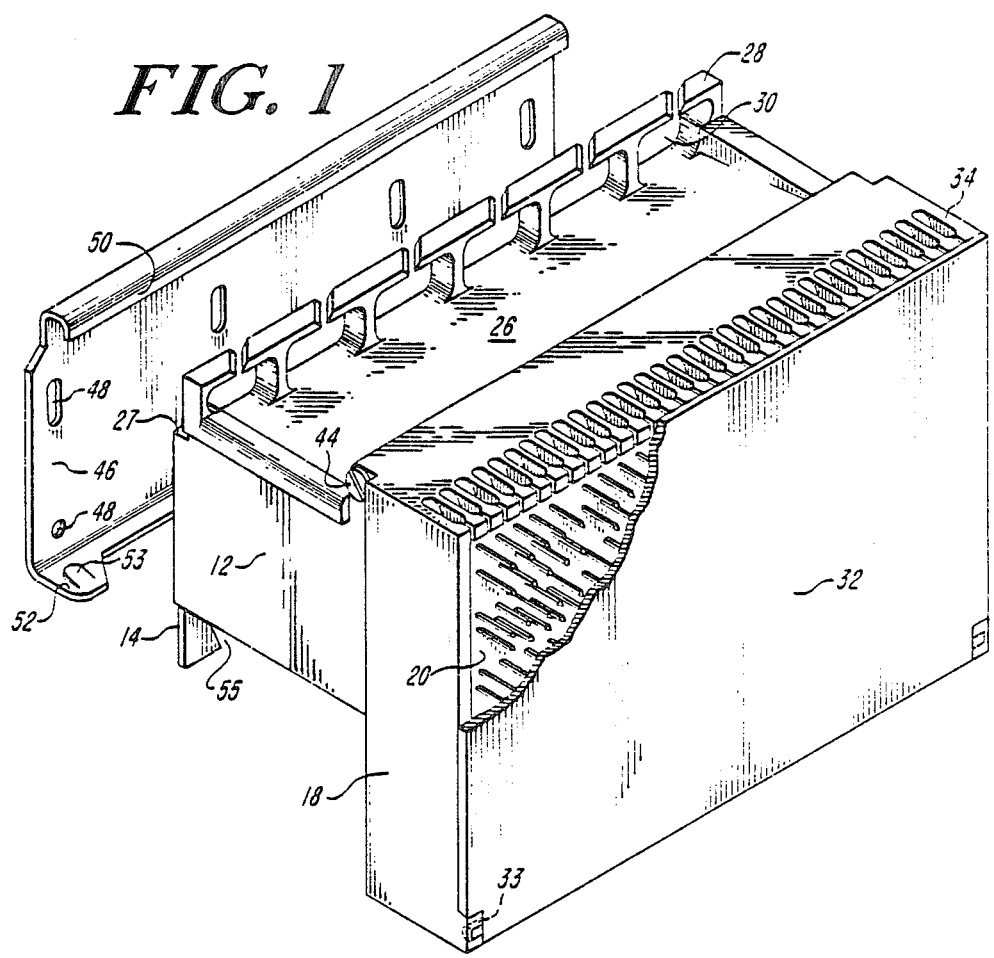
FIG. 1 is a pictorial view, partly cutaway, of a connectorized terminal block in accordance with the invention.
Figure 2:
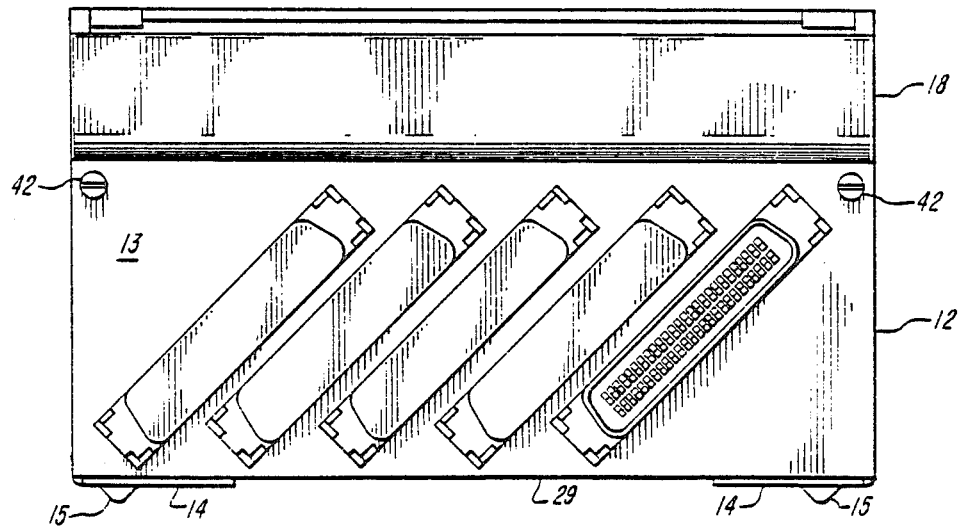
FIG. 2 is a bottom view of the terminal block.

Referring to the drawings, a connectorized terminal block constructed and operative in accordance with the invention is shown, and includes a housing 10 having a first section 12 with mounting plates 14 on the rear wall 29 thereof and a plurality of mating connectors 16 mounted along the bottom wall 13 thereof, and a second housing section 18 hinged to the first section 12 and containing a terminal field 20 having terminal pins with portions 22 wired internally to intended pins 17 of the connectors 16, and outer portions 24 wired to cross connecting wires 54. A cover 26 is provided for the first housing section 12 and includes a rear fanning strip 28 having a plurality of wire channels 30. A cover 32 is provided on the second housing section 18 and is pivotally attached by pins 33 to the front of this section for access to the outer terminal pins, for protection of the wired connections and for label space as required by the user to identify connections.

The terminal pins are disposed in a terminal field defined by an insulative sheet 40 having openings in which the respective terminals are disposed and secured. The terminals carried by the terminal field can be single post wire wrapped terminals, bifurcated wire wrapped terminals or insulation displacement bifurcated terminals. The terminal field in the illustrated embodiment provides a capacity for up to 608 single post terminals, with a 19×32 matrix of holes allowing for multiple configuration possiblities with 16×32 single post patterns, 8×32 bifurcated wire wrap terminal patterns and 12×32 insulation displacement bifurcated terminal patterns. Multiple configurations are possible with most pattern requirements due to the multiplicity of holes in comparison to the number of terminals typically required. The terminal field can be silk screened or otherwise marked in a checkboard or other pattern for ease of terminal location and such pattern can be provided in various configurations depending on the intended arrangement of terminals for particular applications.

The second housing section 18 includes a fanning strip 34 for the cross connecting wires 54, which contains for the illustrated embodiment 32 slots corresponding to the 32 terminal rows of the terminal field. The fanning strip 34 provides positive wire retention, wire strain relief and easy identification of individual circuits. The second housing section 18 can pivot up to 90° with respect to the first housing section 12 by loosening the screws 42 on the bottom of the second housing to permit ease of access to the connectors 16 for cable removal, to permit terminal replacement as necessary, or to permit field wiring modification or maintenance. The section 18 pivots about an axis defined by fastener 44.

The first housing section is typically stamped and fromed from steel, as is the mounting bracket. The second housing section is of molded high quality thermoplastic, as is the top cover of the first housing section, and the front cover of the second housing section.

A mounting bracket 46 has a variety of circular and elongated openings 48 therethrough to provide a universal mounting configuration for use on all standard telephone industry distributing frames. The bracket includes a rolled lip 50 along one edge and latch tabs 52 on the opposite edge to permit the connectorized terminal block housing 10 to be snapped onto and retained by the mounting bracket. The mounting bracket is installed on the distributing frame by threaded fasteners or other convenient fastening elements. The terminal block is mounted by inserting an upper edge 27 of the rear wall 29 at the rear of the first housing section under the roller lip 50 of the mounting bracket and snapping the mounting plates 14 of the first housing section 12 of the terminal block over detents 53 of the mounting brackets tabs 52. No auxiliary hardware is needed to attach the terminal block to the mounting bracket 46. The terminal block can be easily removed from the mounting bracket by using a screw driver or other tool in the slots 55 provided on the bottom edges of the mounting plates 14 and employing a prying force to urge the housing out of the mounting tabs 52. The mounting plates 14 include stiffening ribs 15 which prevent bending of the plates and facilitate repeatable snap action attachment of the terminal block the mounting bracket 46.

The connectors 16 are telephone industry standard male plug ribbon conenctors which are adapted to mate with cooperative female receptacle ribbon connectors. The connectors are disposed at an angle as shown to minimize the depth of the housing.

The terminal block is typically mounted horizontally as illustrated in FIG. 1 with the fanning strips 28 at the top rear edge and the connectors 16 on the bottom. The terminal block can also be mounted vertically with the fanning strips on the side.

The manner of cross connecting wires to the terminal block is as illustrated in FIG. 4. The wires 54 are routed through the front and rear fanning strips 34, 28 and are connected to respective terminals 24. The wires are maintained in orderly disposition by the slots of the fanning strips for easy of identification and replacement if necessary. After all cross connectors are made to the terminal field, the front cover 32 is closed over the terminal field to enclose the users wired terminations.

In the illustrated embodiment the housing is about 4 inches high by 8 inches wide, with a depth of about 6 inches. The terminal block can also be embodied in a more compact unit with a depth of about 4¾ inches. The terminal blocks can be end-to-end mounted in either vertical or horizontal positons for size efficient installations.

The invention is not to be limited by what has been shown and described except as intended in the appended claims.

What is claimed is:

1. A connectorized terminal block, comprising:
a first housing section having a rear mounting surface, a bottom wall, an open front, and a cover spaced apart from said bottom wall, said cover including a fanning strip having a plurality of wire channels, and wherein said bottom wall has a plurality of mating connectors mounted therealong;
a second housing section attached by pivot means to said first housing section adjacent said open front, wherein said second housing section is pivotable through an angle of about 90° to open and closed positions, respectively, in relation to said first housing section, and wherein said second housing section is operative in the closed position to cover said open front and operative in the open position to expose said open front for access to an interior of said first housing section;
a terminal field disposed within said second housing section, said terminal field including an array of electrical terminal pins having internal rearward facing portions directed toward the interior of said first housing section with said second housing section in the closed position and external forward facing portions directed opposite to said internal rearward facing portions;
the second housing section including a fanning strip adjacent said pivot means, said fanning strip having a plurality of wire channels;
a front cover pivotally attached to said second housing section and operative to enclose said terminal field therein;
an insulative sheet depending interiorly in said second housing section having disposed therein said array of electrical terminal pins to define said terminal field;
said internal rearward facing portions of said array of electrical terminal pins adapted for electrical connection to intended pins of the plurality of mating connectors;
said external forward facing portions of said array of electrical terminal pins adapted for electrical connection to cross connecting wires routed thereto via said plurality of wire channels of said fanning strips of said cover and said second housing section, respectively; and
a mounting bracket adapted for attachment to a mounting surface wherein said rear mounting surface of said first housing section includes means cooperative with the mounting bracket for snap action retention of said connectorized terminal block therewith.

2. The connectorized terminal block of claim 1 wherein said rear mounting surface includes an upper edge, an edge opposite said upper edge, and one or more mounting plates extending from said edge oppositely of said upper edge, and wherein the mounting bracket includes a lip portion and one or more latch tabs on opposed edges thereof,
the lip portion coacting with said upper edge and the one or more latch tabs coacting with said mounting plates for snap action retention of said connectorized terminal block to the mounting bracket.

3. The connectorized terminal block of claim 1 further comprising
mounting plates adapted for attachment to the mounting bracket, and
wherein said mounting plates associated with said rear mounting surface of said first housing section include stiffening ribs to facilitate snap action retention of said mounting plates of said connectorized terminal block on the mounting bracket thereby preventing bending of said mounting plates.

4. A connectorized terminal block, comprising:
a first housing section having an interior, a rear mounting surface, a bottom wall, an open front, and a cover spaced apart from said bottom wall, said cover including a fanning strip having a plurality of wire channels, and wherein said bottom wall has a plurality of mating connectors mounted therealong;
a second housing section, including
pivot means for pivotally attaching said second housing section to said first housing section, and wherein said second housing section is pivotable through an angle of about 90° to open and closed positions in relation to said first housing section;

a fanning strip adjacent said pivot means, said fanning strip having a plurality of wire channels;

an insulative sheet depending interiorly in said second housing section;

a terminal field disposed within said second housing section in said insulative sheet, said terminal field containing an array of electrical terminal pins having inward facing portions directed toward said interior of the first housing section with said second housing section in the closed position and adapted for electrical connection to intended pins of the plurality of mating connectors, and outward facing portions directed opposite to said inward facing portions and adapted for electrical connection to cross connecting wires routed thereto via said plurality of wire channels of said fanning strips of said cover and said second housing section, respectively; and a front cover pivotally attached to said second housing and operative to cover said terminal field disposed therein;

said second housing section being pivotally attached adjacent said open front of said first housing section, and wherein said second housing section is operative in a the closed position to cover said open front thereby enclosing said interior of said first housing section and operative in said open position to expose said open front of said first housing section thereby permitting access to said interior thereof.

5. The connectorized terminal block of claim 4 wherein said rear mounting surface includes a first edge portion and a second edge portion opposite said first edge portion and at least one mounting plate depending from said second edge portion, and wherein a mounting bracket adapted for attachment to a mounting surface has a lip portion which coacts with said first edge portion and corresponding tabs which coact with said at least one mounting plate for snap action retention of said connectorized terminal block to the mounting bracket.

6. The connectorized terminal block of claim 4 wherein a mounting bracket adapted for attachment to a mounting surface coacts with said rear mounting surface of said first housing section and further wherein said rear mounting surface includes means cooperative with the mounting bracket for snap action retention of said connectorized terminal block to the mounting bracket.

7. The connectorized terminal block of claim 4 wherein a mounting bracket adapted for attachment to a mounting surface coacts with said rear mounting surface of said first housing section and further wherein said rear mounting surface includes mounting plates depending therefrom having associated therewith stiffening ribs to facilitate snap action retention of said connectorized terminal block on the mounting bracket and to prevent bending of said mounting plates.

8. A connectorized terminal block, comprising:
a first housing section having an interior, a rear mounting surface, a bottom wall for containing a plurality of electrical connectors, an open front, and a cover spaced from said bottom wall including a fanning strip having a plurality of wire channels, and wherein said rear mounting surface includes a mounting plate on each side thereof, each of said mounting plates having a first edge portion, a stiffening rib extending transverse to said first edge portion and a slot in the edge portion opposite to said first edge portion, said mounting plates being cooperative with a mounting bracket having a lip portion cooperative with said first edge portions of said mounting plates and means for snap action retention of said mounting plates; and a second housing section including
pivot means to attach said second housing section to said first housing section wherein said second housing section is pivotable to open and closed postions with respect to said first housing section, a fanning strip along an edge adjacent to said pivot means and having a plurality of wire channels, a terminal field disposed within said second housing section and on an inner surface thereof and containing an array of electrical terminals having inward facing portions directed toward said interior of said first housing section with said second housing section in the closed position and adapted for electrical connection by respective wires to respective pins of the connectors and outward facing portions directed opposite to said inward facing portions operative for electrical connection to respective wires routed thereto via said wire channels provided by said fanning strips, and a front cover pivotally attached to said second housing and operative to cover said terminal field therein;

said second housing section being attached adjacent said open front of said first housing section and operative in the closed position to cover said open front and enclose said interior of said first housing section, and operative in the open position to expose said open front of said first housing section and permit access to said interior thereof.

9. A connectorized terminal block, comprising:
a first housing section having a rear mounting surface, a bottom wall for containing a plurality of electrical connectors, an open front, and a cover spaced from said bottom wall including a fanning strip having a plurality of wire channels, and wherein said rear mounting surface includes a mounting plate on each side thereof, each of said mounting plates having a first edge portion, a stiffening rib extending transverse to said first edge portion and a slot in the edge portion opposite to said first edge portion;

a second housing section attached by pivot means to said first housing section at said open front of said first housing section, said second housing section being pivotable to open and closed positions with respect to said first housing section, and wherein said second housing section is operative in the closed position to cover said open front and operative in the open position to expose said open front for access to the interior of said first housing section;

a terminal field disposed within said second housing section and containing an array of electrical terminals having internal rearward facing portions directed toward said first housing section with said second housing section in the closed position and external forward facing portions directed opposite to said internal rearward facing portions;

said second housing section including a fanning strip along an edge adjacent the pivot means and having a plurality of wire channels, and a front cover pivotally attached to said second housing section and operative to enclose said terminal field therein;

said rearward portions of said terminals being adapted for electrical connection by respective wires to respective pins of said connectors;

said forward facing portions of said terminals being operative for electrical connection to respective wires routed thereto via said wire channels provided by said fanning strips; and a mounting bracket adapted for attachment to a mounting surface wherein said rear mounting surface of said first housing section includes means cooperative with the mounting bracket for snap action retention of said terminal block.

* * * * *